(12) United States Patent
Dalmia et al.

(10) Patent No.: US 10,756,033 B2
(45) Date of Patent: Aug. 25, 2020

(54) WIRELESS MODULE WITH ANTENNA PACKAGE AND CAP PACKAGE

(71) Applicant: Intel IP Corporation, Santa Clara, CA (US)

(72) Inventors: Sidharth Dalmia, Portland, OR (US); Igal Yehuda Kushnir, hod-Hasharon (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/306,833

(22) PCT Filed: Jun. 3, 2016

(86) PCT No.: PCT/US2016/035682
§ 371 (c)(1),
(2) Date: Dec. 3, 2018

(87) PCT Pub. No.: WO2017/209761
PCT Pub. Date: Dec. 7, 2017

(65) Prior Publication Data
US 2019/0139915 A1    May 9, 2019

(51) Int. Cl.
*H01L 23/66* (2006.01)
*H01L 23/552* (2006.01)
(Continued)

(52) U.S. Cl.
CPC .............. *H01L 23/66* (2013.01); *H01L 23/42* (2013.01); *H01L 23/5226* (2013.01);
(Continued)

(58) Field of Classification Search
CPC .............. H01L 23/5383; H01L 23/5384; H01L 23/5385; H01L 23/5389; H01L 2223/6677;
(Continued)

(56) References Cited

U.S. PATENT DOCUMENTS 6,770,955 B1\* 8/2004 Coccioli ............. H01L 23/3128
257/659
9,160,055 B2\* 10/2015 Tsutsumi ............. H01Q 1/2266
(Continued)

FOREIGN PATENT DOCUMENTS

EP        0978729        2/2000
EP        2502311        9/2012
(Continued)

OTHER PUBLICATIONS

International Search Report and Written Opinion for PCT application No. PCT/US2016/035682, dated Feb. 28, 2017, 9 pages.
(Continued)

*Primary Examiner* — Jasmine J Clark
(74) *Attorney, Agent, or Firm* — Eversheds Sutherland (US) LLP

(57) ABSTRACT

Wireless modules having a semiconductor package attached to an antenna package and cap package are disclosed. The semiconductor package may have one or more electronic components disposed thereon. The antenna package may be communicatively coupled to the semiconductor package using by one or more coupling pads. The antenna package may further have one or more radiating elements for transmitting and or receiving wireless signals. The cap package may also be attached to the semiconductor package on a side opposing the side on which the antenna package is disposed. The cap package may provide routing and/or additional antenna elements. The cap package may also allow for thermal grease to be dispensed therethrough. The antenna package, the cap package, and the semiconductor package may have dissimilar number of interconnect layers and/or dissimilar materials of construct.

20 Claims, 8 Drawing Sheets

(51) Int. Cl.
*H01L 25/10* (2006.01)
*H01L 23/538* (2006.01)
*H01L 23/42* (2006.01)
*H01L 23/522* (2006.01)
*H01L 23/00* (2006.01)
*H01Q 1/22* (2006.01)
*H01L 25/065* (2006.01)
*H01L 23/367* (2006.01)
*H01L 23/31* (2006.01)

(52) U.S. Cl.
CPC ...... *H01L 23/5383* (2013.01); *H01L 23/5384* (2013.01); *H01L 23/5385* (2013.01); *H01L 23/5389* (2013.01); *H01L 23/552* (2013.01); *H01L 24/09* (2013.01); *H01L 25/105* (2013.01); *H01Q 1/2283* (2013.01); *H01L 23/3121* (2013.01); *H01L 23/3677* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 24/92* (2013.01); *H01L 25/0655* (2013.01); *H01L 2223/6677* (2013.01); *H01L 2224/13111* (2013.01); *H01L 2224/13147* (2013.01); *H01L 2224/16227* (2013.01); *H01L 2224/2919* (2013.01); *H01L 2224/2929* (2013.01); *H01L 2224/29298* (2013.01); *H01L 2224/32225* (2013.01); *H01L 2224/4847* (2013.01); *H01L 2224/48227* (2013.01); *H01L 2224/73204* (2013.01); *H01L 2224/73253* (2013.01); *H01L 2224/73265* (2013.01); *H01L 2224/92125* (2013.01); *H01L 2225/1023* (2013.01); *H01L 2225/1058* (2013.01); *H01L 2225/1088* (2013.01); *H01L 2924/14* (2013.01); *H01L 2924/145* (2013.01); *H01L 2924/1432* (2013.01); *H01L 2924/1433* (2013.01); *H01L 2924/1434* (2013.01); *H01L 2924/1436* (2013.01); *H01L 2924/1437* (2013.01); *H01L 2924/1443* (2013.01); *H01L 2924/1461* (2013.01); *H01L 2924/14335* (2013.01); *H01L 2924/14511* (2013.01); *H01L 2924/15153* (2013.01); *H01L 2924/15159* (2013.01); *H01L 2924/15331* (2013.01); *H01L 2924/16235* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
CPC ... H01L 2924/16235; H01L 2924/1433; H01L 2924/1443; H01L 2924/145; H01L 2924/19105; H01L 24/13; H01L 2924/00; H01L 23/3677; H01L 24/73; H01L 24/09; H01L 2224/48227; H01L 2224/32225; H01L 25/0655; H01L 2224/73253; H01L 2224/13147; H01L 2924/1461; H01L 23/5226; H01L 2924/14; H01L 24/48; H01L 23/66; H01L 24/16
See application file for complete search history.

(56) References Cited

U.S. PATENT DOCUMENTS

| | | | |
|---|---|---|---|
| 9,401,350 B1 * | 7/2016 | We | H01L 23/5384 |
| 2007/0229281 A1 | 10/2007 | Yutaka et al. | |
| 2009/0256752 A1 | 10/2009 | Johannes et al. | |
| 2011/0049652 A1 | 3/2011 | Wu et al. | |
| 2012/0280380 A1 | 11/2012 | Kamgaing | |
| 2014/0111394 A1 | 4/2014 | Eunyoung et al. | |
| 2015/0001731 A1 | 1/2015 | Shuto | |
| 2015/0303149 A1 | 10/2015 | Zhai et al. | |
| 2016/0049723 A1 | 2/2016 | Wilhelmus et al. | |

FOREIGN PATENT DOCUMENTS

| | | |
|---|---|---|
| KR | 20070115877 | 12/2007 |
| WO | 2016031807 | 3/2016 |

OTHER PUBLICATIONS

European Search Report for European Application No. 16904216.5, dated Nov. 11, 2019 (11 pages).

* cited by examiner

__US 10,756,033 B2__

1

WIRELESS MODULE WITH ANTENNA PACKAGE AND CAP PACKAGE

CROSS-REFERENCE TO RELATED APPLICATION(S)

This application is a U.S. National Stage Application under 35 U.S.C. 371 and claims the priority benefit of International Application No. PCT/US16/35682, filed Jun. 3, 2016, which is incorporated herein by reference as if set forth in full.

TECHNICAL FIELD

This disclosure generally relates to wireless modules, and more particularly to a wireless module with an antenna package and cap package.

BACKGROUND

Integrated circuit(s) and other electronic devices may be packaged on a semiconductor package. The semiconductor package may be integrated onto an electronic system, such as a consumer electronic system. The package may include an antenna with an array of antenna radiating elements. The design latitude of the antenna, in this case, may be limited by the design needs of the rest of the semiconductor package, or vice-versa.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1:
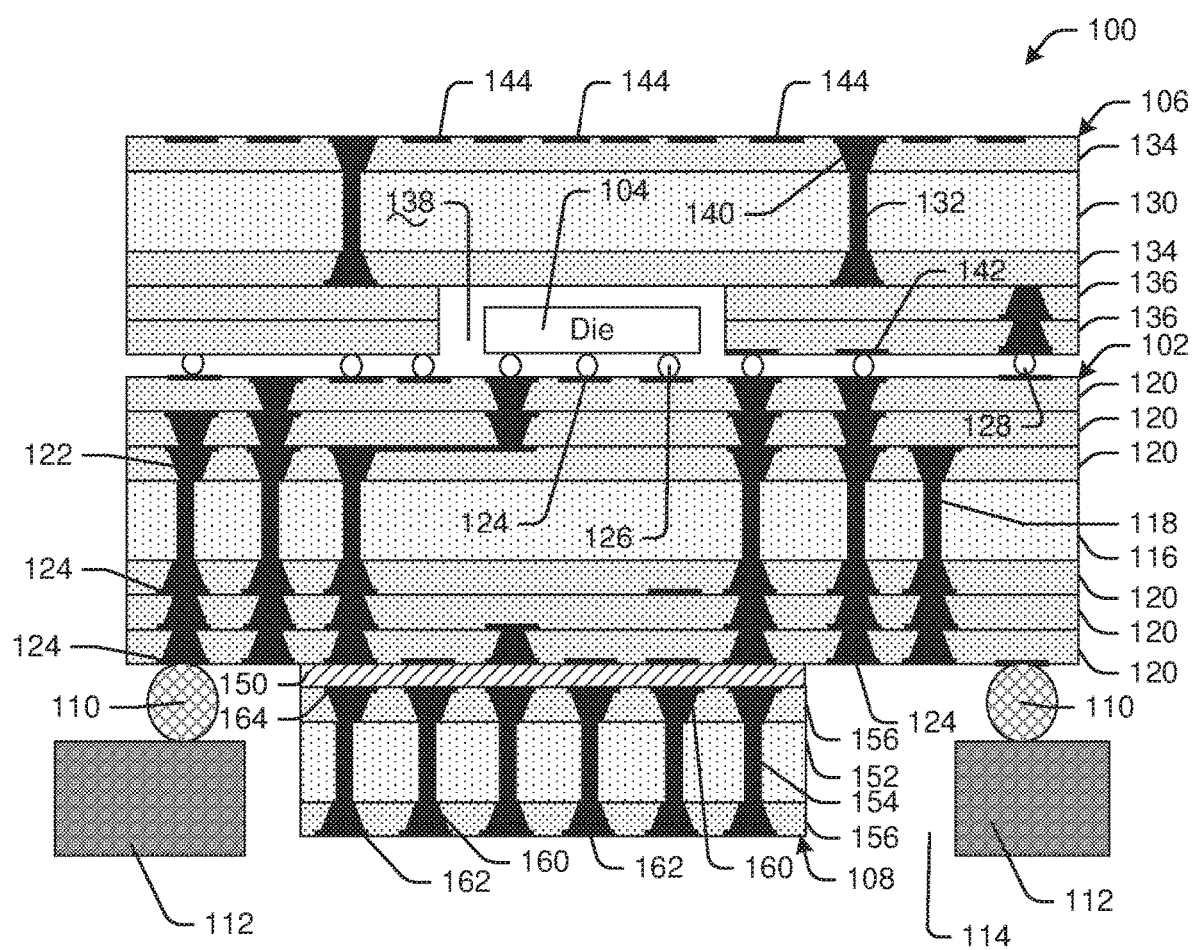
FIG. 1 depicts a simplified cross-sectional schematic diagram illustrating a configuration of a wireless module having an antenna package, a semiconductor package, and a cap package with package-to-board interconnects disposed on the same side as the antenna package, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or removal of the material or photoresist as required in forming a described structure.

In accordance with example embodiments of the disclosure, wireless modules may have a semiconductor package, an antenna package, and a cap package. The semiconductor package may have one or more electrical components (e.g., integrated circuit (IC) dies, radio frequency ICs (RFICs), surface mount devices (SMDs), etc.) disposed thereon. The antenna package may have radiating elements of an antenna provided thereon. The antenna elements may be of any suitable type, such as patch antennas, stacked patches, dipoles, monopoles, etc., and may have different orientations and/or polarizations. In some example embodiments, an antenna may further be implemented as surface mounted antennas. The cap package may have any one or more of electrical components attached thereto, antenna elements, thermal management materials, and/or routing thereon. In some example embodiments, the cap package may have one or more antenna elements that are self-contained on a top and/or on sides of the cap package. In some alternative embodiments, the cap package may have a portion of antenna element(s) that resides partially on the semiconductor package and partially on the cap package.

In example embodiments, the antenna package may be constructed of different materials than the semiconductor package. For example, the antenna package may use higher dielectric constant (high-k)/tunable/ultra-low-k/metamaterials/magnetic materials. In some embodiments, the antenna package may have pockets of air (e.g., airgaps) that may enhance antenna performance. In example embodiments, the antenna package and the semiconductor package may have dissimilar numbers of build-up and/or interconnect layers. For example, the semiconductor package, may have six build-up layers and the antenna package may include a single layer dielectric strip. In example embodiments, the antenna package may be attached to the semiconductor package by any suitable mechanism, such as by epoxy, adhesives, glue, tape, lamination, soldered connections, and/or metallic bonding. Any of the various packages may be fabricated using a core-based and/or a coreless substrate. Additionally, the main package may be constructed using relatively thinner layers, while the antenna package may be constructed using relatively much thicker materials. In example embodiments, where the antenna package is attached to the semiconductor package using epoxy, I/O pads of the semiconductor package may be coupled to I/O pads of the antenna package inductively and/or capacitively. The antenna package may be smaller or larger in size than the main RFIC carrier. The antenna package itself may have several components mounted/soldered thereon which are connected electrically and/or electromagnetically with the main RFIC carrier.

In further example embodiments, the cap package may be constructed of different materials than the semiconductor package. For example, the cap package may use higher dielectric constant (high-k)/tunable/ultra low-k/metamaterials/magnetic materials. In example embodiments, the cap package and the semiconductor package may have dissimilar numbers of build-up and/or interconnect layers. For example, the semiconductor package, may have four build-up layers and the cap package may have six build-up layers. In example embodiments, the cap package may be attached to the semiconductor package by any suitable mechanism, such as by epoxy, adhesives, glue, tape, lamination, soldered connections, and/or metallic bonding. Additionally, the semiconductor package and the cap package may be constructed using different thickness layers. In example embodiments, the cap package may be attached to the semiconductor package in a fashion similar to how electronic components may be attached to the semiconductor package. For example, a flip-chip-like and/or copper pillar-like mechanism may be used to mechanically and/or electrically couple the cap package to the semiconductor package. In example embodiments, where the cap package is attached to the semiconductor package using epoxy, I/O pads of the semiconductor package may be coupled to I/O pads of the antenna package inductively and/or capacitively. The antenna package may be smaller or larger in size than the main semiconductor package with a radio frequency integrated circuit (RFIC). The cap package itself may have several components mounted/soldered thereon which may be connected electrically and/or electromagnetically with the semiconductor package.

In example embodiments, the cap package may have one or more cavities, such as cavities formed in the build-up layers of the cap package to accommodate the electrical components disposed on the semiconductor package. The cavity may be formed by having routing exclusion zones where a portion of the build-up layers may be removed, such as by laser ablation, controlled depth drilling, or other suitable mechanisms. When the cap package is flipped over, aligned, and placed onto the semiconductor package, the cavity may provide a sufficient clearance for electronic components disposed on the semiconductor package, where those electronic components may be capped by the cap package after assembly of the cap package onto the semiconductor package. The recess, as defined by build-up layers in the cap package, may have different depths along the surface of the cap package to accommodate SMT components of different heights disposed upon the semiconductor package and/or cap package. The cap package may also be constructed using a relatively high density interposer ring of any suitable shape with any suitably shaped PCB and/or package mounted on top of the interposer. The cap package itself may have edge plated walls internally or externally to allow for EMI shielding and/or thermal conduction. In these embodiments, using an interposer, the assembled dies and/or interposer may be mechanically protected using an overmold. The overmold, in example embodiments, may overly and span beyond the surface of the underlying interposer and/or semiconductor package. The overmold may protect interconnects of electronic components, such as an RFIC mounted to the semiconductor package, as well as the interposer. The overmold may be disposed on one or both sides of the semiconductor package and selectively shielded.

In example embodiments, the cap package may have one or more through-holes that may enable distribution of thermal grease therethrough after assembly of the cap package onto the semiconductor package. The through hole may be of suitable size such that a dispensing process and/or a squeegee process may be used to push thermal grease or other thermal management material through the through hole and into a cavity formed between the semiconductor package and the cap package. The thermal grease may, in some cases, contact one or more electronic components that may be a source of heat within the wireless module, such as an RFIC chip. Indeed, the thermal grease may be disposed in a manner such that thermal energy may be conducted away from an electronic component disposed on the semiconductor package, through the cap package, and then external to the wireless module.

In some example embodiments, antenna array elements (e.g., radiating elements) may be provided on the capping package. In other words, there may be antenna elements on both the antenna package and the cap package. In example embodiments, the antenna elements of the cap package may be on an opposing side of the semiconductor package than the antenna package. The antenna element of the antenna package and the antenna elements of the cap package may radiate and/or receive electromagnetic signals from a location of space that may be substantially non-overlapping. As a result, in some example embodiments, having antenna elements on either side of the package substrate, by way of the cap package and the antenna package, a wider (e.g., 360 degree) field of radiation and/or reception may be achieved. In other example embodiments, two different signals or set of signals may be transmitted and/or received from the antenna elements on the cap package and the antenna elements on the antenna package.

In some example embodiments, the semiconductor package may have one or more connectors, such as AFL connectors, disposed thereon. It may be via these connectors that the wireless module may communicate signals to and/or from external entities. In some example embodiments, there may be both package-to-board (e.e., BGA, LGA, etc.) connections and a one or more connectors disposed on the semiconductor package. The connectors may be coupled to the semiconductor package by any suitable mechanism, such as copper pillar, flip chip, solder bumps, ACF, NCF, etc. In some example embodiments, the connector may not be capped with the cap package. In other words, some electrical components may be disposed on the semiconductor package in a cavity formed by the cap package, but the connector may be outside of that cavity.

According to example embodiments, the semiconductor package may include a substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. The build-up layers, as built up on the core, may have interconnects, or traces, formed therein. The traces may provide electrical pathways for signals between electronic components (e.g., integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like. The build-up layers may be fabricated on one or both sides of the package core. In some cases, there may be the same number of build-up layers on both sides of the package core. In other cases, the build-up layers formed on either side of the package core may be asymmetric. The stack-up may also be asymmetric by having different layer thicknesses on either side of the core. Furthermore, the core of the semiconductor package may have a plurality of through vias to make electrical connections from one side of the core to the other side of the core. Thus, through vias in the core may allow electrical connections between one or more build-up layers on the top of the semiconductor package to one or more build-up layers on the bottom of the semiconductor package. In some alternative embodiments, a coreless substrate may be used, where the semiconductor package may not have a core. The layers in the substrate can be disparate, and of different thicknesses. It is possible for such a package to have components embedded in them, such as Si/packaged Si, and/or other SMT components.

One or more electronic components, including at least one integrated circuit die, may be electrically and mechanically coupled to the package substrate via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, copper pillar or the like. In some example embodiments, the dies (e.g., integrated circuits) that are packaged in the semiconductor package, as described herein, may have input/output (I/O) connections for various sizes. For example, a particular die may have finer pitch I/O connections than another die packaged on the semiconductor package. The die assembly and and/or other components, such as an interposer, may, in some example embodiments, be encapsulated, either entirely or partially, by overmold. The overmold may also be used to protect the antenna package. The overmold, in still further embodiments, may be selectively plated to provide shielding and/or electromagnetic interference (EMI) protection.

In some example embodiments, the build-up layers on the bottom of the core may have one or more input/output (I/O) connections between the semiconductor package and a board. In other example embodiments, build-up layers on the top of the semiconductor package may have one or more package-to-board interconnects. Semiconductor package-to-board level interconnects may be provided on one or both sides of the package substrate. In example embodiments, the semiconductor package-to-board level interconnects may be ball grid array (BGA) connections, land grid array (LGA), other area connections, periphery connections, or the like. In addition, or alternatively, in example embodiments, the semiconductor package may have a connector disposed thereon, such as an AFL connector for making connections to cables directly from the semiconductor package substrate. The semiconductor component may also be pre-packaged as a wafer level chip scale package (WL-CSP), embedded wafer level ball grid array (e-WLB), flip chip-chip scale package (FC-CSP).

In example embodiments, the antenna package may also include a substrate. The antenna package may, on one side, have interconnect structures for receiving and/or sending wireless signals from/to the semiconductor package. For example, such interconnect structures may be metal interconnects between pads on the antenna package and pads on the semiconductor package. Thus, in these example embodiments, the antenna package may be coupled to the semiconductor package by conductive contacts. Examples of such metallic, conductive connections may include flip-chip connections, metal (e.g., copper) pillar, solder bumps, any type of low-lead or lead-free solder bumps, anisotropic conductive film (ACF), or any other suitable connections between the antenna package and the semiconductor package. In other example embodiments, the pads on the antenna package may be aligned to corresponding pads on the semiconductor package and attached using epoxy and/or adhesives (e.g., adhesive tape). In these cases, the epoxy may be sufficiently thick that leakage current therethrough may be relatively negligible. Thus, when using epoxy and/or adhesive to attach the antenna package to the semiconductor package, the signals (e.g., RF signals) between the semiconductor package and the antenna package may be inductively and/or capacitively coupled. For example, if a pad of the antenna module is separated from a corresponding pad of the semiconductor module with a dielectric epoxy disposed therebetween, the reactance of either of the pads may be sufficient to transmit the signal from one pad to the other using electromagnetic fields generated by one or the other pad. In some example embodiments, the epoxy and/or adhesive joining the semiconductor package to the antenna package may be relatively thick, such as greater than 10 microns (μm). In some example embodiments, the epoxy may have a relatively high dielectric constant (high-k), such that there is sufficient reactance-based coupling between pads on the antenna package and corresponding pads on the semiconductor package.

In example embodiments, in addition to a mechanism for coupling to the semiconductor package, the antenna package may have a mechanism for radiating electro-magnetic signals (e.g., RF wireless signals). The antenna package may have one or more radiating elements disposed thereon that may radiate the wireless signals, as received from the semiconductor package. Additionally, the antenna package may have radiative reception elements that may receive electro-magnetic signals that may be routed to the semiconductor package (e.g., to RFICs disposed on the semiconductor package). In some example embodiments, the antenna package may include a single interconnect layer having both the coupling elements (e.g., pads) to the semiconductor package and the radiative elements (e.g., receiving and/or transmitting radiative elements). In some example embodiments, the antenna package may have an area that is less than an area of the package substrate. In other example embodiments, the antenna package may have an area that is greater than the semiconductor package. In example embodiments, the antenna package may be assembled on the opposing side of the semiconductor package as the electronic components and/or the cap package.

Similar to the semiconductor package and/or the antenna package, in example embodiments, the cap package may also include a substrate. In other example embodiments, the cap package may be a coreless integration, where the cap package does not have a core layer. The cap package may, on one side, have interconnect structures (e.g., flip-chip, copper pillar, reactance coupled, etc.) for receiving and/or sending wireless signals from/to the semiconductor package. For example, such interconnect structures may be metal interconnects (e.g., solder, copper, etc.) between pads on the cap package and pads on the semiconductor package. Thus, in these example embodiments, the cap package may be coupled to the semiconductor package by conductive contacts. Examples of such metallic, conductive connections may include flip-chip connections, metal (e.g., copper) pillar, solder bumps, any type of low-lead or lead-free solder bumps, anisotropic conductive film (ACF), or any other suitable connections between the antenna package and the semiconductor package. In other example embodiments, the pads on the cap package may be aligned to corresponding pads on the semiconductor package and attached using epoxy and/or adhesives (e.g., adhesive tape). In these cases, the epoxy may be sufficiently thick that leakage current therethrough may be relatively negligible. Thus, when using epoxy and/or adhesive to attach the cap package to the semiconductor package, the signals (e.g., RF signals) between the semiconductor package and the cap package may be inductively and/or capacitively coupled.

In some example embodiments, the cap package may provide routing traces to route, signals, power, ground, clock, or the like. The routing traces may, for example, carry signals between electronic components disposed on the semiconductor package and/or the cap package. In this way, the cap package may allow for a smaller x-y form factor by providing some routing of on-wireless module signals on routing at least partially overlying electronic components (e.g., RFICs, other ICs, SMDs, etc.) of the wireless module. The cap package may have any suitable number of build-up layers on one or both sides of a core layer. The cap package, in example embodiments, may further include through-vias for routing signals from one side of the cap package core to the other side of the cap package core. In example embodiments, a side (e.g., topside) of the cap package may have a portion of one or more build-up layers removed to define a cavity. When the cap package is assembled onto the semiconductor package, the cavity formed on the surface of the cap package may provide clearance for the electronic devices that may be assembled onto the semiconductor package and/or the cap package. The cavity may be formed in the cap package by any suitable removal process, such as laser ablation (e.g., $CO_2$ laser, UV laser, etc.), patterned wet etching, patterned dry etching, controlled depth saw, combinations thereof, or the like. In the design phase of the cap package, there may be design rules to exclude any metal traces and/or vias in the regions of build-up layers that are to subsequently be removed to form the cavity.

In example embodiments, in addition to a mechanism for coupling to the semiconductor package, the cap package may have a mechanism for radiating electro-magnetic signals (e.g., RF wireless signals). Like the antenna package, in example embodiments, the cap package may have one or more radiating elements disposed thereon that may radiate a wireless signals. In other words, the cap package may have radiative reception elements that may receive electro-magnetic signals that may be routed to the semiconductor package (e.g., to RFICs disposed on the semiconductor package) and/or transmit electro-magnetic signals that may be received from the semiconductor package. Thus, in these embodiments, the wireless module may have radiative elements on either side of the semiconductor package. In some cases, this may afford a wider angle over which a wireless signal may be transmitted and/or received. In other cases, the antenna elements of the cap package may transmit and/or receive different wireless signals than the antenna elements of the antenna package. In some example embodiments, the cap package may have an area that is less than an area of the semiconductor package. In other example embodiments, the cap package may have an area that is greater than the semiconductor package. In example embodiments, the cap package may be assembled on the same side of the semiconductor package as the electronic components using the same or different interconnects as those used for assembling the electronic components onto the semiconductor package.

In some example embodiments, the cap package may have electronic components (e.g., ICs, SMDs, etc.) assembled thereon. These components may be assembled, in example embodiments, prior to the assembly of the cap package onto the semiconductor package. In further example embodiments, the cap package may have electro-magnetic interference (EMI) shielding structures on the edges of the cavity and/or on the outside of the cap package. These EMI shielding structures may be formed using any variety of edge plating techniques, such as edge plating copper on the edges of the cap package. In still further example embodiments, the cap package may have an opening therein that allows for insertion of thermal grease material therethrough. The opening may be formed by any suitable technique, such as laser ablation, wet etching, and/or dry etching. The opening may be positioned over the cavity that may be formed in the cap package and may further be positioned over an electronic device assembled onto the semiconductor package (e.g., RFIC) on which thermal grease is to be applied. The opening may be sufficiently wide enough and of any suitable shape to allow the flow of thermal grease therethrough, such as by injection and/or squeegee processes. The thermal grease may be provided, in example embodiments, after the cap package has been assembled onto the semiconductor package. The thermal grease provided through the cap package may be of any suitable type, such as epoxies, silicones, urethanes, acrylates, solvents, combinations thereof, or the like. The thermal grease may further have any suitable fillers therein, such as silver, aluminum oxide, zinc oxide, aluminum nitride, combinations thereof, or the like. The thermal grease may have any suitable properties, such as any variety of thermal conductivity to conduct thermal energy from one or more electrical components, electrical insulation to prevent unwanted leakage current, viscosity and/or thixotropic properties suitable for injection of the thermal grease through the opening in the cap package.

It will be appreciated that by forming an antenna package and/or cap package separately from the semiconductor package, greater design latitudes, lower costs, reduced form factor, greater manufacturing yield, and/or better performance may be achieved for both the semiconductor package. If the antenna package, the cap package, and the semiconductor package were integrated in the same package, all of the package(s) may be forced to having the number and type of core and/or build-up layers (e.g., pre-preg dielectric layers, metal layers, etc.), with the same thicknesses, dielectric constants, and other properties. By dividing out the antenna package, the cap package, and the semiconductor package, each element may be manufactured with materials, structure, and/or processes that may be relatively optimal for that package. For example, the semiconductor package may be manufactured with eight layers of interconnect (e.g., four build-up layers on either side of the core) to accommodate routing to, from, and in between a plurality of dies provided on the semiconductor package, such as in SiP-type implementation. The antenna package, on the other hand, in this example, may only have a single layer (e.g., a strip of dielectric with pad interfaces on one side and radiating elements on the other side). The cap package may have two build-up layers on either side of the cap package core.

It will be appreciated that forcing the antenna package and/or the cap package to be integrated with the semiconductor package may result in the antenna package and/or the cap package of an integrated package to have a number of routing layers of the semiconductor package. Thus, by separately forming each of the antenna package, semiconductor package, and the cap package, extra materials and processing may be eliminated in manufacturing the wireless module. Additionally, the antenna package and/or cap package may be forced to use the dielectric and/or metal materials chosen for the semiconductor package, if an integrated package was to be formed. Of course, alternatively, the semiconductor package may be forced to use the dielectric and/or metal materials that are used for the antenna package and/or the cap package in an integrated package. Therefore, by separating out the semiconductor package from the antenna package, in non-limiting examples, a low-k dielectric may be used in the semiconductor package to route signals with reduced parasitics (e.g., reduced resistive-capacitive (RC) delays), while relatively higher-k materials may be employed in the antenna package to enable reduced form factor antennas.

The cap package may use one or both of low-k and high-k build-up layers, depending on whether the cap package may have antenna radiating elements disposed thereon. For example, if the cap package primarily serves a purpose of routing signals between electronic components disposed on the semiconductor package and/or the cap package, then one or more of the build-up layers may use low-k materials to reduce parasitic s. However, if the cap package has radiating antenna elements, then high-k dielectric build-up materials may be utilized in constructing the cap package. Of course, the cap package may also be constructed with low-k build-up dielectrics at routing layers and high-k dielectrics for layers where antenna radiating elements may be disposed.

In example embodiments, thinner dielectric layers may be chosen for the semiconductor package since they may result in tightly bound fields, minimizing undesired radiation and coupling from transmission lines; and thicker dielectric layers may be chosen for the antenna package to provide better efficiency, loosely bound fields for improved radiation into space, and/or greater bandwidth. Further still, it will be appreciated that by building smaller package substrates, by using the structures, apparatus, systems, and methods, as disclosed herein, each of the semiconductor package, cap package, and the antenna package may have a smaller area and fewer processes individually, resulting in potential cost and manufacturing yield advantages.

FIG. 1 depicts a simplified cross-sectional schematic diagram illustrating a configuration of a wireless module 100 having an antenna package 108, semiconductor package 102, and cap package 106 with package-to-board interconnects 110 disposed on the same side as the antenna package 108, in accordance with example embodiments of the disclosure.

The semiconductor package 102 may have a core 116 with one or more through-vias 118, and one or more build-up layers 120. The build-up layers 120 may have one or more vias 122 and/or metallic traces 124 formed therein to route signals, ground, and/or power throughout the semiconductor package 102. Traces 124 on a top build-up layer 120 may be in the form of one or more pads onto which a die 104 may be attached with die-to-package interconnects 126. The semiconductor package 102 may further have pads 124 on a bottom build-up layer 120 which may be used to interface with the antenna package 108 attached to the semiconductor package 102 via epoxy and/or adhesive 150. The antenna package 108 may include a core layer 152, and build-up layers 156. The core 152 may have one or more through-vias 154 to route signals from one side of the core 152 to the other side of the core 152. The build-up layers may include vias 160 and/or metallic traces 162, 164. The metallic traces 164 in a top build-up layer 156 of the antenna package 108 may interface with corresponding pads 124 of the semiconductor package 102 to send and/or receive signals to and/or from, respectively, the semiconductor package 102. The metallic traces 162 of a bottom build-up layer 156 of the antenna package 108 may include antenna elements (e.g., radiating elements and/or reception elements). The cap package 106 may include a core layer 130, and build-up layers 134, 136. The core 130 may have one or more through-vias 132 to route signals from one side of the core 130 to the other side of the core 130. The build-up layers 134, 136 may include vias 140 and metallic traces 142, 144. The metallic trace 142 in a bottom build-up layer 136 of the cap package 106 may interface with corresponding pads 124 of the semiconductor package 102 to send and/or receive signals to and/or from, respectively, the semiconductor package 102 via one or more package-to-package interconnects 128. The metallic trace 144 of a top build-up layer 134 of the cap package 106, in some example embodiments, may include antenna elements (e.g., radiating elements and/or reception elements). In other example embodiments, the cap package may not have antenna elements and the traces 144 may include additional routing layers.

In example embodiments, semiconductor package core 116, antenna package core 152, and/or cap package core 130 may have build-up layers 120, 134, 136, 156 formed thereon. In example embodiments, the package substrate, the antenna substrate, and/or cap package substrate may be singulated into separate semiconductor packages 102, antenna packages 108, and/or cap packages 106 after completing other fabrication processes in a batch fashion with other packages on the same panel. The semiconductor package core 116, antenna package core 152, and/or cap package core 130 may be of any suitable size and/or shape. For example, the semiconductor package core 116, antenna package core 152, and/or cap package core 130, in example embodiments, may be a rectangular panel. In example embodiments, the cores 116, 130, 152 may be fabricated of any suitable material, including polymer material, ceramic material, plastics, composite materials, glass, epoxy laminates of fiberglass sheets, FR-4 materials, FR-5 materials, combinations thereof, or the like. The cores 116, 130, 152 may have through vias 118, 132, 154 formed therein. Through vias 118, 132, 154 may be used for propagating electrical signals from the top of the package core 116, 130, 152 to the bottom of the package core 116, 130, 152, and vice versa. It will be appreciated that in some example embodiments, the core 116 material may be the same as core 130 material and/or the core 152 material. In other example embodiments, one or more of the cores 116, 130, 152 cores may be constructed of different materials from the other of the cores 116, 130, 152.

The build-up layers 120, 134, 136, 156 may have dielectric materials and electrical connections 122, 124, 140, 142, 144, 160, 162, 164 (e.g., vias, pads, traces, etc.) thereon. The semiconductor package coupling pads 124 and the antenna package coupling pads 164, as well as the cap package coupling pads 142 and semiconductor package coupling pads 124 may have a relatively greater area compared to other electrical traces, in some example embodiments.

The build-up layers 120, 134, 136, 156 or interconnect layer may be formed by a variety of suitable processes. Dielectric material may be laminated on the semiconductor package core 116, antenna package core 130, and/or cap package core 152. In example embodiments, the dielectric laminate may be any suitable material, including polymer material, ceramic material, plastics, composite materials, liquid crystal polymer (LCP), epoxy laminates of fiberglass sheets, prepreg, FR-4 materials, FR-5 materials, combinations thereof, or the like. In some example embodiments, the package core 116, 130, 152 and the build-up dielectric material 120, 134, 136, 156 may be the same type of material. In other example embodiments, the package core 116, 130, 152 and the build-up dielectric material 120, 134, 136, 156 may not be constructed of the same material type. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively, within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

It will be appreciated that the number of build-up layers in the semiconductor package 102 may be different from the number of build-up layers in the antenna package 108 and/or the cap package 106. Although the semiconductor package 102 is shown with six layers of interconnect (e.g., three build-up layers 120 on either side of the core 116), it will be understood that there may be any suitable number of interconnect layers. It will further be appreciated that the number of build-up layers on either side of the core 116 may be asymmetric in some cases. It will be appreciated that although electronic components 104 (e.g., ICs) are depicted as being assembled on a surface of the semiconductor package 102, in some example embodiments, there may be one or more electronic components 104 embedded within the build-up layers 120 of the semiconductor package 102.

Similar to the semiconductor package 102, the antenna package 108 may also have any suitable number of build-up layers and may, optionally, have an asymmetric build-up on either side of the core 152. In fact, in some example embodiments the antenna package 108 may include a single layer of radiative elements (e.g., patch antenna radiative elements, spiral antenna elements, etc.) coupled to corresponding pads of the semiconductor package 102. Although the antenna package 108 is shown as having less area than the semiconductor package 102, it will be appreciated that according to example embodiments, the semiconductor package 102 and the antenna package 108 of the wireless module 100 may have any suitable relative area. It will be appreciated that due to the antenna package 108 being fabricated separately from the semiconductor package 102 and/or the cap package 106, the number of layers of build-up and materials selected may be tuned specifically to the applications of the antenna package 108. For example, low-k pre-preg layers may be used in the semiconductor package 102 to allow for high-frequency, low signal degradation signaling. On the other hand, high-k materials may be used for the antenna package 108 to enable miniaturization of the radiative elements 162. In some example embodiments, the antenna package 108 may have radiative elements plated on sidewalls of the antenna package 108, such as on sides of the core 152 and/or the build-up layers 156.

Similar to the semiconductor package 102 and the antenna package 108, the cap package 106 may also have any suitable number of build-up layers 134, 136 and may, optionally, have an asymmetric build-up on either side of its core 130. In some example embodiments, the cap package 106 may include a top layer of traces 144 that may include radiative elements (e.g., patch antenna radiative elements) driven by electrical connections 142, 132, 140, which may in turn, be driven by the semiconductor package 102. Although the cap package 106 is shown as having an area similar to the semiconductor package 102, it will be appreciated that according to example embodiments, the semiconductor package 102 and the cap package 106 of the wireless module 100 may have any suitable relative area. It will be appreciated that due to the cap package 106 being fabricated separately from the semiconductor package 102 and/or the antenna package 108, the number of layers of build-up and materials selected may be tuned specifically to the applications of the cap package 106. For example, low-k pre-preg layers may be used in the cap package 106 to allow for high-frequency, low signal degradation signaling. In other cases, high-k materials may be used for the cap package 106 to enable miniaturization of the radiative elements 144, if the cap package 106 includes such radiative elements 144. In example embodiments, the dielectrics used in the semiconductor package 102, cap package 106, and/or antenna package 108 may have k values in the range of about 2 to about 9. In example embodiments, build-up layers may include dielectric layers with a thickness in the range of about 25 microns (μm) to about a few 100 μm and metal layers in the range of about 10 μm to about 40 μm.

The build-up layers 134, 136 of the cap package 106 may have a cavity 138 defined therein. The cavity 138 may be formed by selective removal of portions of some build-up layers 136, without removing other build-up layers 134. The cavity 138 may be formed to accommodate (e.g., provide clearance for) electronic components 104 disposed on the semiconductor package 102 and/or the cap package 106. The cavity 138 may be formed in the cap package by any suitable removal process, such as laser ablation (e.g., $CO_2$ laser, UV laser, etc.), patterned wet etching, patterned dry etching, controlled depth saw, combinations thereof, or the like. In the design phase of the cap package 106, there may be design rules to exclude any metal traces and/or vias in the regions of build-up layers 136 that are to subsequently be removed to form the cavity 138. In some cases, relatively large (e.g., potentially in violation of otherwise valid design rules) metal traces may be provided on build-up layer 134 and under the regions of the build-up layers 136 that are to be removed, to promote delaminative removal of portions of the build-up film 136 to form the cavity 138.

It will be appreciated that although no electronic components (e.g., ICs) are depicted as being assembled on or embedded in the cap package 106, in some example embodiments, there may be one or more electronic components embedded within the cavity 138 of the cap package 106 or embedded within the build-up layers 134, 136 of the cap package 106. When electronic components are embedded in the build-up layers 134, 136 of the cap package 106, cavities may be formed in the build-up layers 134, 136 and the electronic components may be embedded within the cavities and subsequent build-up layers may be formed overlying the embedded electronic component.

The die 104 may be attached by any suitable mechanism to the semiconductor package 102. The die 104 may be any suitable electronic components including, but not limited to, integrated circuits, surface mount devices, active devices, passive devices, diodes, transistors, connectors, resistors, inductors, capacitors, microelectromechanical systems (MEMSs), combinations thereof, or the like. The die 104 may be electrically and mechanically coupled to corresponding pads 124 of the semiconductor package 102 via any suitable die-to-package interconnect 126, such as metal pillars (e.g., copper pillars), flip chip bumps, solder bumps, any type of low-lead or lead-free solder bumps, tin-copper bumps, wire bonds, wedge bonds, controlled collapse chip connect (C4), anisotropic conductive film (ACF), nonconductive film (NCF), combinations thereof, or the like. In some example embodiments, the type of contact may be different for different dies mounted on the semiconductor package 102. For example, one die may have copper pillar contacts and another die may have solder bump contacts. In other example embodiments, different dies mounted on the semiconductor package 102 may have the same type of contacts (e.g., all dies have copper pillar contacts).

In some cases, underfill (e.g., with or without filler materials) (not shown) may be provided between the die 104 and the semiconductor package 102, such as surrounding die-to-package interconnects 126. Underfill epoxy may be dispensed by a nozzle under and/or adjacent to the semiconductor package 102. The underfill epoxy may move by capillary action and/or Van der Waals forces to a position under the die 104. In some example embodiments, when the cap package 106 is assembled onto the semiconductor package 102, the underfill may be provided between the cap package 106 and the semiconductor package 102. Again, if an underfill is used between the semiconductor package 102 and the cap package 106, the underfill may or may not have filler materials therein.

Representative underfill epoxy materials may include an amine epoxy, imidazole epoxy, a phenolic epoxy or an anhydride epoxy. Other examples of underfill material include polyimide, benzocyclobutene (BCB), a bismalleimide type underfill, a polybenzoxazine (PBO) underfill, or a polynorbornene underfill. Additionally, the underfill epoxy may include one or more suitable filler materials, such as silica. In example embodiments, the underfill epoxy may have fillers and/or other materials therein to preferentially control the coefficient of thermal expansion (CTE), reduce stresses, impart flame retardant properties, promote adhesion, and/or reduce moisture uptake in the underfill epoxy. Additives and/or chemical agents may be included in the underfill epoxy for desirable properties, such as a preferred range of viscosity, a preferred range of tackiness, a preferred range of hydrophobicity (e.g., surface wetting), a preferred range on particle suspension properties, a preferred range of cure temperatures, combinations thereof, or the like.

The underfill epoxy may be cured to form the underfill between the die 104 and the semiconductor package 102. The cure process may include heating and/or radiation (e.g., ultraviolet (UV) cure, and/or combinations thereof). During the cure process, the underfill epoxy may cross-link and harden. Although the underfill epoxy is depicted with a relatively straight sidewall, it will be appreciated that in some example embodiments, the underfill epoxy may have a fillet with a curved sidewall. Additionally, underfill epoxy residue may remain in portions of the semiconductor package substrate 102 surface where the underfill epoxy may have been originally deposited.

The semiconductor package 102 may be mechanically coupled to the antenna package 108 via any suitable mechanism, such as epoxy, adhesives, tape, mechanical holders, metal contacts, or the like. In example embodiments, the epoxy 150 may be deposited onto one of the semiconductor package 102 or the antenna package 108. Next, the other of the semiconductor package 102 and the antenna package 108 may be aligned and placed on the semiconductor package 102 having the epoxy thereon. This alignment and placement mechanism may be achieved using a pick- and place tool, such as a tool that uses optical alignment to align objects to be bonded to each other. Next the epoxy may be cured to form the epoxy-based attachment of the semiconductor package 102 to the antenna package 108. It will be appreciated that the curing of the epoxy may drive cross-linking and/or hardening of the epoxy material 150. In some cases, B-stage epoxy may be used for staging the semiconductor package 102 to the antenna package 108 and then a curing process may be used for a final cure of the B-stage epoxy. In other example embodiments, adhesives or tape may be disposed on one or the other of the semiconductor package 102 or the antenna package 108, and the other of the semiconductor package 102 or the antenna package 108 may be aligned and placed. In example embodiments, the epoxy/adhesive/tape 150 may be selected to desirable properties in the coupling between pads 124 of the semiconductor package 102 and the pads 164 of the antenna package 108.

In some cases, electrical components may be provided on the cap package 106 and/or antenna package 108. For example, inductors, capacitors, and/or resistors may be disposed on the cap package 106 and/or antenna package 108. By placing these components on the antenna package 108, processing steps for the semiconductor package 102 may be reduced. Additionally, overall areal and/or volumetric reductions (e.g., relatively desirable form factor) may be realized by not only placement of discrete components on the antenna package, but also from separating the antenna portion and the die portions into separate packages.

The package-to-board interconnects 110 may be any suitable type of package-to-board interconnects, such as BGA, LGA, other area arrays, peripheral interconnects, combinations thereof, or the like that may enable electrical connections to a board 112. In some example embodiments, the board 112 may have an opening 114 therein to accommodate the wireless module 100. In some example embodiments, a connector may be used, with or without the package-to-board interconnects 110 to make signaling connection with entities external to the wireless module 100. These embodiments are discussed in conjunction with FIG. 2.

Figure 2:
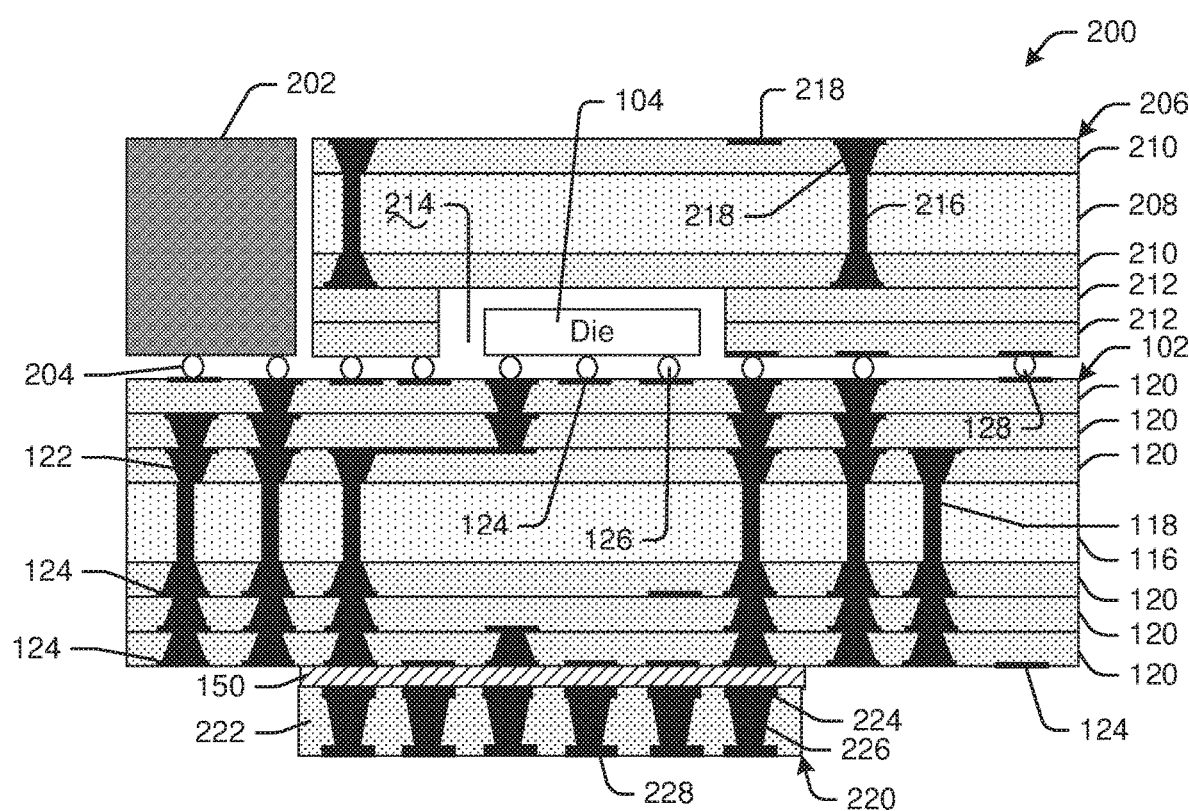
FIG. 2 depicts a simplified cross-sectional schematic diagram illustrating a configuration of a wireless module having an antenna package, a semiconductor package, and a cap package with connectors disposed on the die package, in accordance with example embodiments of the disclosure.

FIG. 2 depicts a simplified cross-sectional schematic diagram illustrating a configuration of a wireless module 200 having a semiconductor package 102, cap package 206, and antenna package 220 with connectors 202 disposed on the semiconductor package 102, in accordance with example embodiments of the disclosure.

In this example embodiment, the antenna package 220 may include a single dielectric layer 222 and the material for the dielectric layer 222 may be similar to core or build-up layer dielectric material. In example embodiments, the dielectric layer 222 may be any suitable material, including polymer material, ceramic material, plastics, composite materials, LCP, epoxy laminates of fiberglass sheets, prepreg, FR-4 materials, FR-5 materials, combinations thereof, or the like. Coupling pads 224 may be provided for electrically coupling (e.g., inductively, capacitively, and/or conductively, etc.) with pads 124 of the semiconductor package 102. The antenna package 220 may further have a plurality of radiative elements 228, such as, for example, antenna elements that are configured to receive and/or transmit signals wirelessly. In example embodiments, the signals received via the coupling pads 224 may be transmitted wirelessly via the radiative elements 228. In the same or different embodiments, wireless signals received via the radiative elements 228 may be provided to the coupling pads 224 such that those signals may be received by the semiconductor package 102 and/or the die 104 (e.g., RFIC) thereon.

It will be appreciated that the coupling between the antenna package 220 and the semiconductor package 102 may use any suitable mechanism including epoxy 150, metallic contacts (e.g., copper pillar, solder bumps, etc.) or mechanisms other than epoxy 150 or metal contacts. According to example embodiments, adhesives, tape, glue, and/or lamination, or indeed any suitable joining mechanism may be used to attach the semiconductor package 102 and the antenna package 202. Although in this disclosure one of the aforementioned joining mechanisms may be depicted for illustrative purposes, it will be noted that any of the other joining mechanisms may be substituted in accordance with example embodiments of the disclosure. It should also be understood that in the following descriptions that semiconductor package 102, cap package 206, and/or the antenna package 220 may have any suitable number of interconnect layers. For example, even if an antenna package 220 resembling antenna package 220 is depicted in a particular configuration, it should be appreciated that a different configuration of the antenna package, such as antenna package 220, may be substituted in that particular depiction without deviating from embodiments of the disclosure. Although a single antenna package 220 is shown, it will be understood that in some example embodiments, two or more antenna packages 220 may be provided with a semiconductor package 102.

In example embodiments, the cap package 206 may have an areal size that is different (e.g., smaller) from the areal size of the semiconductor package 102. The cap package 206 may include a core 208, with through vias 216, and one or more build-up layers 210, 212. One or more build-up layers 212 may have portions removed to define a cavity 214 to accommodate electronic components 104 that may be disposed on the semiconductor package 102 and/or the cap package 206. The build-up layers 210, 212 may further have signaling paths 218, such as vias and/or traces disposed thereon for routing signals, power, ground, and/or clock. In some cases, the signaling paths 218 may form antenna radiating elements, such as at a top portion, opposing the side in contact with the semiconductor package 102 on the cap package 206. In some cases, having antenna elements (e.g., radiating or receiving elements) on the cap package 206 disposed on a semiconductor package along with the antenna package 220 may improve wireless module performance 200, such as by having a greater unidirectional wireless transmit/receive performance and/or a greater angle of transmission and/or reception. In other words, having an antenna package 220 and a cap package 206 on either side of a semiconductor package 102 may provide improved uniformity of power density in reception and/or transmission over a full 360° (e.g., n-fire antennas, broadside antennas, etc.).

The connector 202 may be any suitable type of connector, such as an AFL connector. The connector may enable direct connection of input/output (I/O) cables to the wireless module 200. The connector may be mechanically and/or electrically connected to the semiconductor package via one or more connector-to-package interconnects 204. These interconnects 204 may be of any suitable type (e.g., flip-chip, metal pillar, copper pillar, ACF, NCF, etc.). In some cases, the interconnects 204 may be of the same type as interconnects 126 and/or interconnects 128. In other cases, the interconnects 204 may be of a different type than one or both of interconnects 126, 128. In some example embodiments, the connector 202 and the antenna elements on the antenna package 220 and/or the cap package 206 may be the sole I/O mechanisms of the wireless module 200. In other example embodiments, the connector 202 may be provided along with package-to-board interconnects on the wireless module 200. In some example embodiments, more than one connector 202 may be disposed on the wireless module 200.

Figure 3:
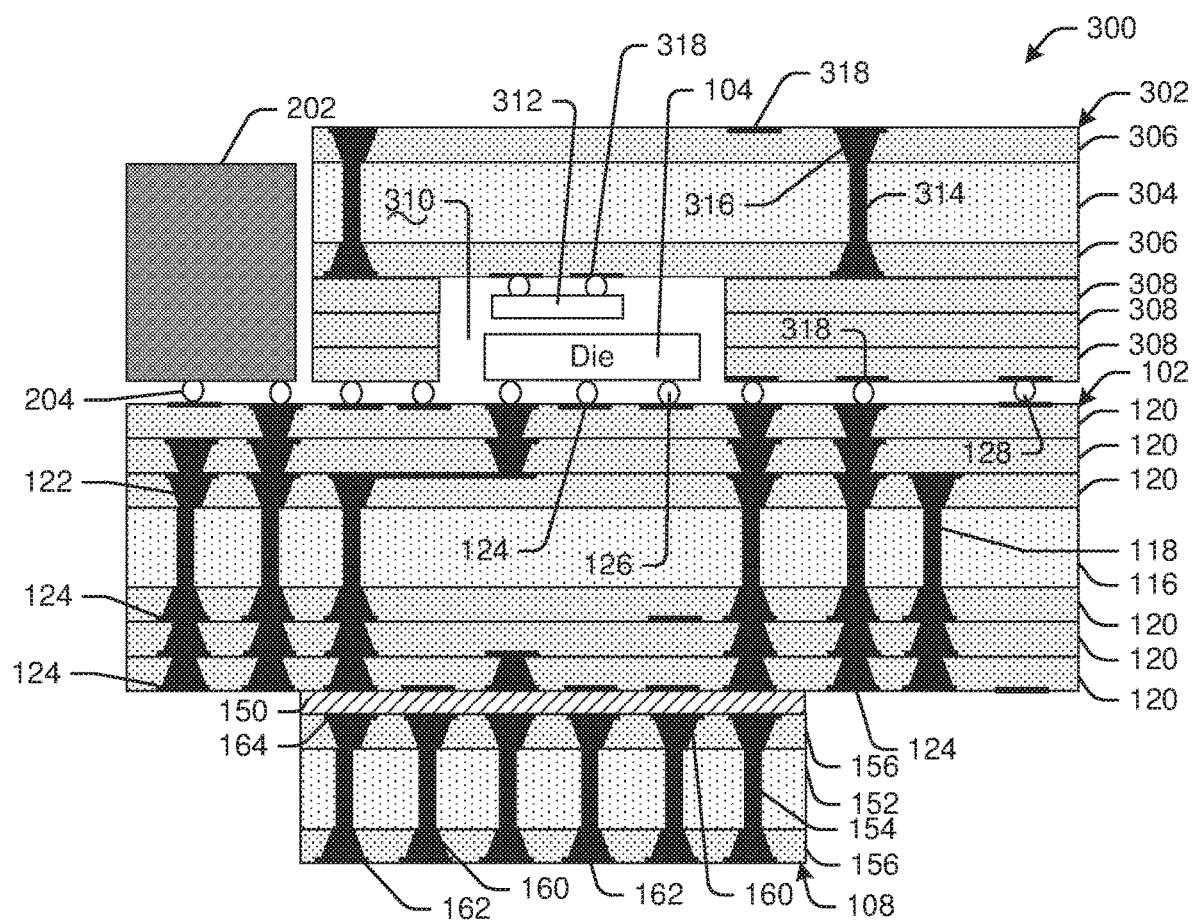
FIG. 3 depicts a simplified cross-sectional schematic diagram illustrating a configuration of a wireless module having an antenna package, a semiconductor package, and a cap package with connectors disposed on the die package and with electronic components disposed on both the die package and the cap package, in accordance with example embodiments of the disclosure.

FIG. 3 depicts a simplified cross-sectional schematic diagram illustrating a configuration of a wireless module 300 having an antenna package 108, semiconductor package 102, and cap package 302 with connectors disposed on the die package and with electronic components 312 disposed on both the die package and the cap package, in accordance with example embodiments of the disclosure.

The cap package 302 may include a core 304, with through vias 314, and one or more build-up layers 306, 308. One or more build-up layers 308 may have portions removed to define a cavity 310 to accommodate electronic components 104, 312 that may be disposed on the semiconductor package 102 and/or the cap package 302. The build-up layers 306, 308 may further have signaling paths 316, 318, such as vias and/or traces disposed thereon for routing signals, power, ground, and/or clock. In some cases, the signaling paths 316, 318 may form antenna radiating elements, such as at a top portion, opposing the side in contact with the semiconductor package 102 on the cap package 302.

As shown, the electrical component 312 may be disposed on the cap package 302 along with electrical components 104 disposed on the semiconductor package 102. As discussed above, electrical component may be attached using any suitable interconnect and/or mechanism (e.g., flip-chip, copper pillar, ACF, NCF, etc.). It will be appreciated that the cavity 310 may have a greater volume than if only the electrical component 104 was attached to the semiconductor package 102, without the electronic component 312 being attached to the cap package 302.

Figure 4:
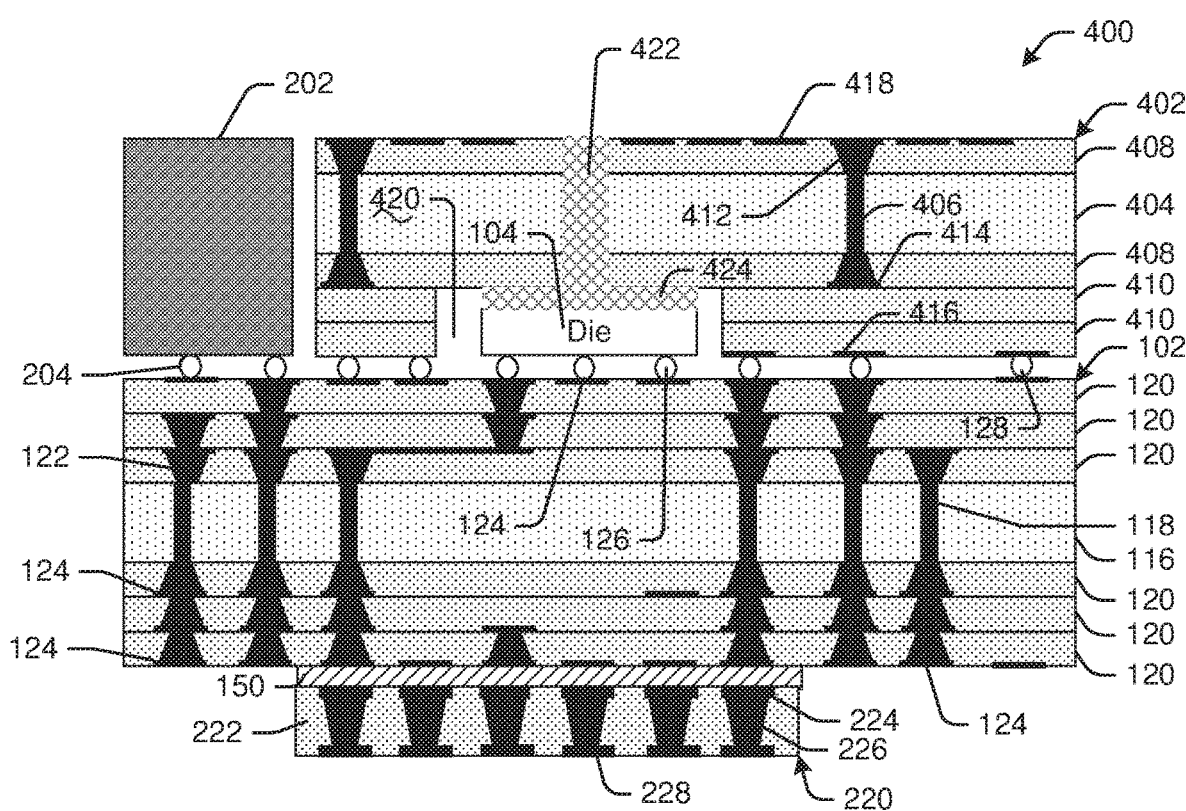
FIG. 4 depicts a simplified cross-sectional schematic diagram illustrating a configuration of a wireless module having an antenna package, a semiconductor package, and a cap package with thermal grease disposed through the cap package, in accordance with example embodiments of the disclosure.

FIG. 4 depicts a simplified cross-sectional schematic diagram illustrating a configuration of a wireless module 400 having an antenna package 220, a semiconductor package 102, and a cap package 402 with thermal grease 422, 424 disposed through the cap package 402, in accordance with example embodiments of the disclosure.

The cap package 402 may include a core 404, with through vias 406, and one or more build-up layers 408, 410. One or more build-up layers 410 may have portions removed to define a cavity 420 to accommodate electronic component 104 that may be disposed on the semiconductor package 102 and/or the cap package 402. The build-up layers 408, 410 may further have signaling paths 412, 414, 416, 418, such as vias and/or traces disposed thereon for routing signals, power, ground, and/or clock. In some example embodiments, the traces 418 may include antenna array elements (e.g., patch antenna elements, etc.). In other example embodiments, the traces 418 may include routing (e.g., signal routing). In yet other example embodiments, the traces 418 may include both routing traces and antenna radiating and/or reception elements.

In example embodiments, during the fabrication of the cap package 402, portions of build-up layers 410 may be removed to define and form cavity 420. Either before or after this process of cavity 420 formation, one or more holes may be formed on one side (e.g., the side opposing a side proximal to the semiconductor package) opening to the cavity 420 of the cap package 402. Alternatively, the one or more holes may be formed from the side of the cap package 402 that is most proximal to the semiconductor package 102. In example embodiments, the hole(s) may be formed by any suitable mechanism, such as laser ablation, wet etch, dry etch, piercing, punching, embossing, combinations thereof, or the like.

In example embodiments, after the hole(s) are formed and the cap package 402 is assembled onto the semiconductor package 102, thermal grease 422, 424 may be disposed into the holes and onto the die 104. In some example embodiments, the thermal grease 422, 424 may be provided by any suitable mechanism, such as by injection and/or squeegee processes. The thermal grease may be provided, in example embodiments, after the cap package has been assembled onto the semiconductor package. In some cases, a clean process may be performed after pushing the thermal grease into the hole to remove any thermal grease residue over the surface of the cap package 402. When the thermal grease 422, 424 is pushed into holes formed in the cap package 402, portions of the thermal grease 424 may be pushed onto the die 104, while other portions of the thermal grease 422 may remain in the hole through which the thermal grease 422, 424 may be pushed. Thus, the thermal grease from portion 424 to portion 422 may provide a conductive pathway to remove thermal energy from die 104. The thermal grease 422, 424 provided through the cap package 402 may be of any suitable type, such as epoxies, silicones, urethanes, acrylates, solvents, combinations thereof, or the like. The thermal grease 422, 424 may further have any suitable fillers therein, such as silver, aluminum oxide, zinc oxide, aluminum nitride, combinations thereof, or the like. The thermal grease 422, 424 may have any suitable properties, such as any variety of thermal conductivity to conduct thermal energy from one or more electrical components 104, electrical insulation to prevent unwanted leakage current, viscosity and/or thixotropic properties suitable for injection of the thermal grease through the opening in the cap package.

Figure 5:
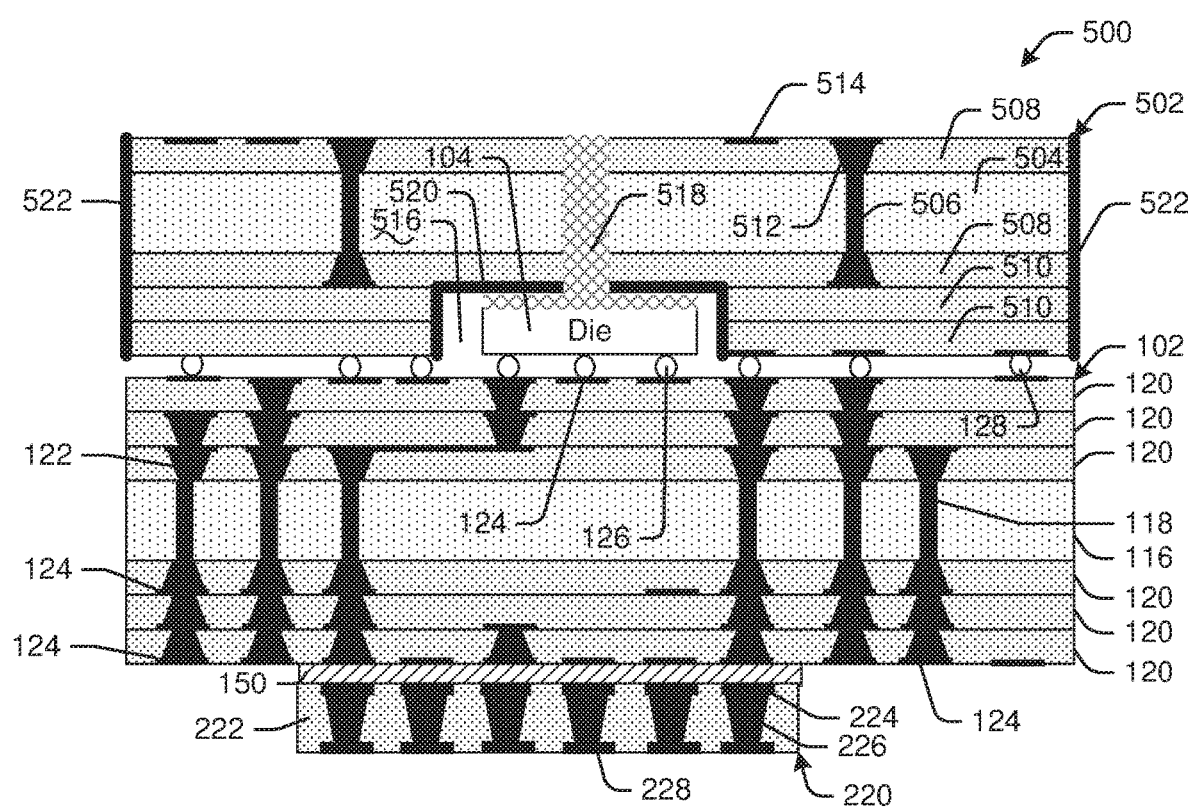
FIG. 5 depicts a simplified cross-sectional schematic diagram illustrating a configuration of a wireless module having an antenna package, a semiconductor package, and a cap package with electromagnetic shielding, in accordance with example embodiments of the disclosure.

FIG. 5 depicts a simplified cross-sectional schematic diagram illustrating a configuration of a wireless module 500 having an antenna package 220, semiconductor package 102, and cap package 502 with electromagnetic shielding 514, 516, in accordance with example embodiments of the disclosure.

The cap package 502 may include a core 504, with through vias 506, and one or more build-up layers 508, 510. One or more build-up layers 510 may have portions removed to define a cavity 516 to accommodate electronic component 104 that may be disposed on the semiconductor package 102 and/or the cap package 502. The build-up layers 508, 510 may further have signaling paths 512, 514, such as vias and/or traces disposed thereon for routing signals, power, ground, and/or clock. In some cases, the signaling paths 512, 514 may form antenna radiating elements, such as at a top portion, opposing the side in contact with the semiconductor package 102 on the cap package 502. There may further be thermal grease disposed on the electronic component 510 and through the cap package 502.

The cap package 502 may further include an electromagnetic interference (EMI) shield 520, 522. The EMI shield 520 may be provided by providing a metal liner on the inside of the cavity 520 of the cap package 502. The EMI shield 522 may be provided by disposing metal on the outer sidewall of the cap package 502. In some cases, one of EMI shield 520 and EMI shield 522 may be provided on the cap package 502. In other cases, both of the EMI shields may be provided on the cap package. In some alternative cases, it will be appreciated that instead of forming EMI shielding on the outer side wall of the cap package, metal 522 may be electrically connected to a signaling line and driven as a radiating element, such as a sidewall antenna. EMI shields 520, 522 may be fabricated prior to assembling the cap package 502 to the semiconductor package 102. In example embodiments, any suitable metal (e.g., copper, gold, tin, refractory metals, etc.) may be provided to form EMI shields 520, 522. In example embodiments, any suitable process may be utilized to deposit the metal of the EMI shields 520, 522, such as electroless plating, electroplating, metallic paste, conductive epoxy, combinations thereof or the like.

Figure 6:
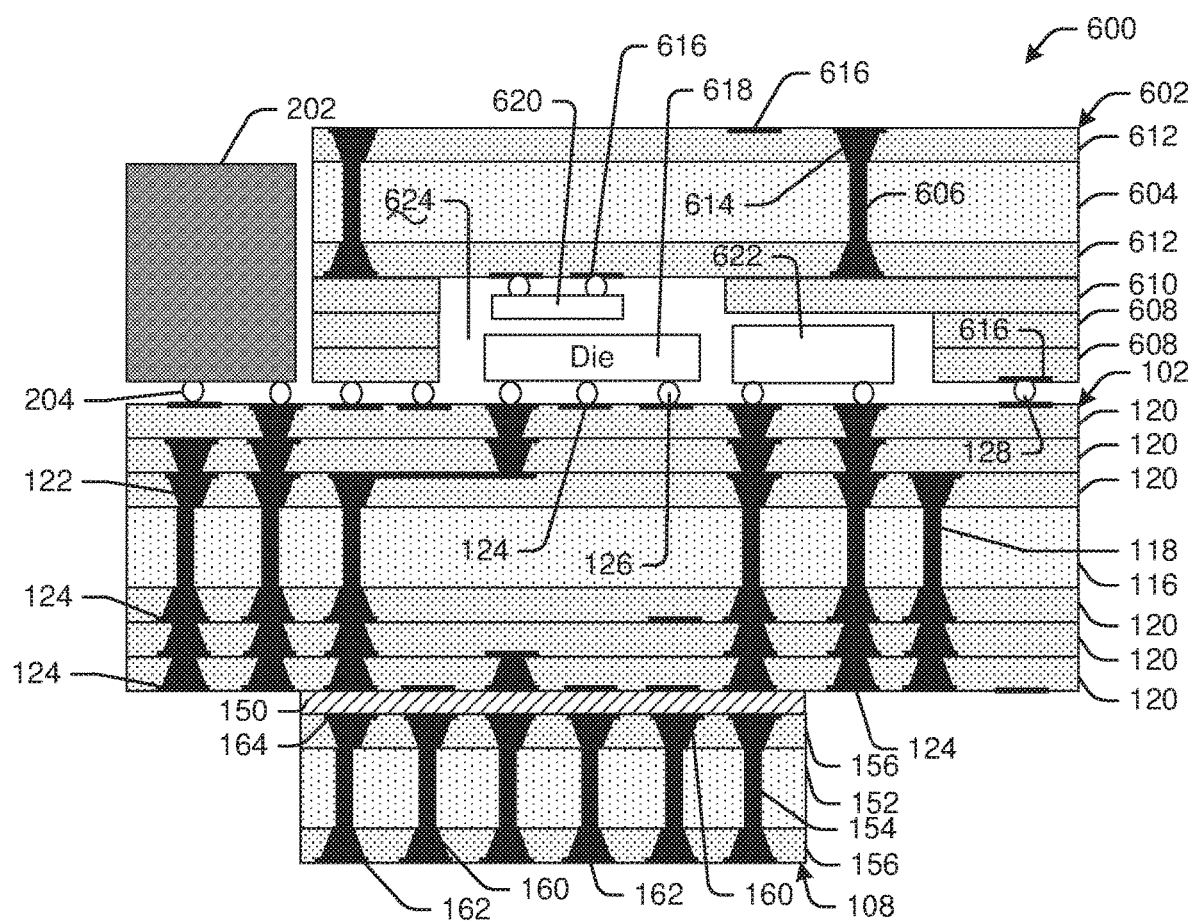
FIG. 6 depicts a simplified cross-sectional schematic diagram illustrating a configuration of a wireless module having an antenna package, a semiconductor package, and a cap package with a cavity of varying height, in accordance with example embodiments of the disclosure.

FIG. 6 depicts a simplified cross-sectional schematic diagram illustrating a configuration of a wireless module 600 having an antenna package 108, semiconductor package 102, and cap package 602 with a cavity 624 of varying height, in accordance with example embodiments of the disclosure.

The cap package 602 may include a core 604, with through vias 606, and one or more build-up layers 608, 610, 612. The build-up layers 608, 610, 612 may further have signaling paths 614, 616, such as vias and/or traces disposed thereon for routing signals, power, ground, and/or clock. In some cases, the signaling paths 616 may form antenna radiating elements, such as at a top portion, opposing the side in contact with the semiconductor package 102 on the cap package 602. There may be one or more electronic components 618, 620, 622 disposed on the semiconductor package 102 and/or the cap package 602.

One or more build-up layers 608, 610 may have portions removed to define a cavity 624 to accommodate electronic components 618, 620, 622 that may be disposed on the semiconductor package 102 and/or the cap package 602. In this example cap package 602, different build-up layers 608, 610 may have portions removed that are substantially non-overlapping. For example, build-up layers 608 may be removed in certain portions where build-up layer 610 may not be removed, such as to accommodate the stand-off of the electronic component 622. However, in other regions, build-up layers 608, 610 are removed to accommodate the combined height of the electronic components 618 and 620. The various portions of removal of build-up dielectric may be performed by any suitable processes, such as laser ablation (e.g., $CO_2$ laser, UV laser, etc.), patterned wet etching, patterned dry etching, controlled depth saw, combinations thereof, or the like.

It will be appreciated that although a tiered recess 624 has been depicted for the purposes of accommodating both semiconductor package assembled die 618 and cap package assembled die 620, in other example embodiments, a tiered recess may be used to accommodate varying heights of different electronic components that may be disposed on the semiconductor package. Indeed, when electronic elements with relatively greater height are disposed on the semiconductor package 102 along with electronic elements with a relatively lower height, the regions of the cap package overlying the relatively greater height electronic components may have an additional one or more build-up layers removed relative to the regions overlying the electronic components with relatively lower height. It will be appreciated that in embodiments where there are varying heights of the cavity 624, in some cases, holes may be formed in the cap package 602 overlying some or all of the electronic components provided on the semiconductor package 102 to provide thermal grease therethrough to form relatively high thermal conductivity pathways away from one or more of the electronic components.

Figure 7:
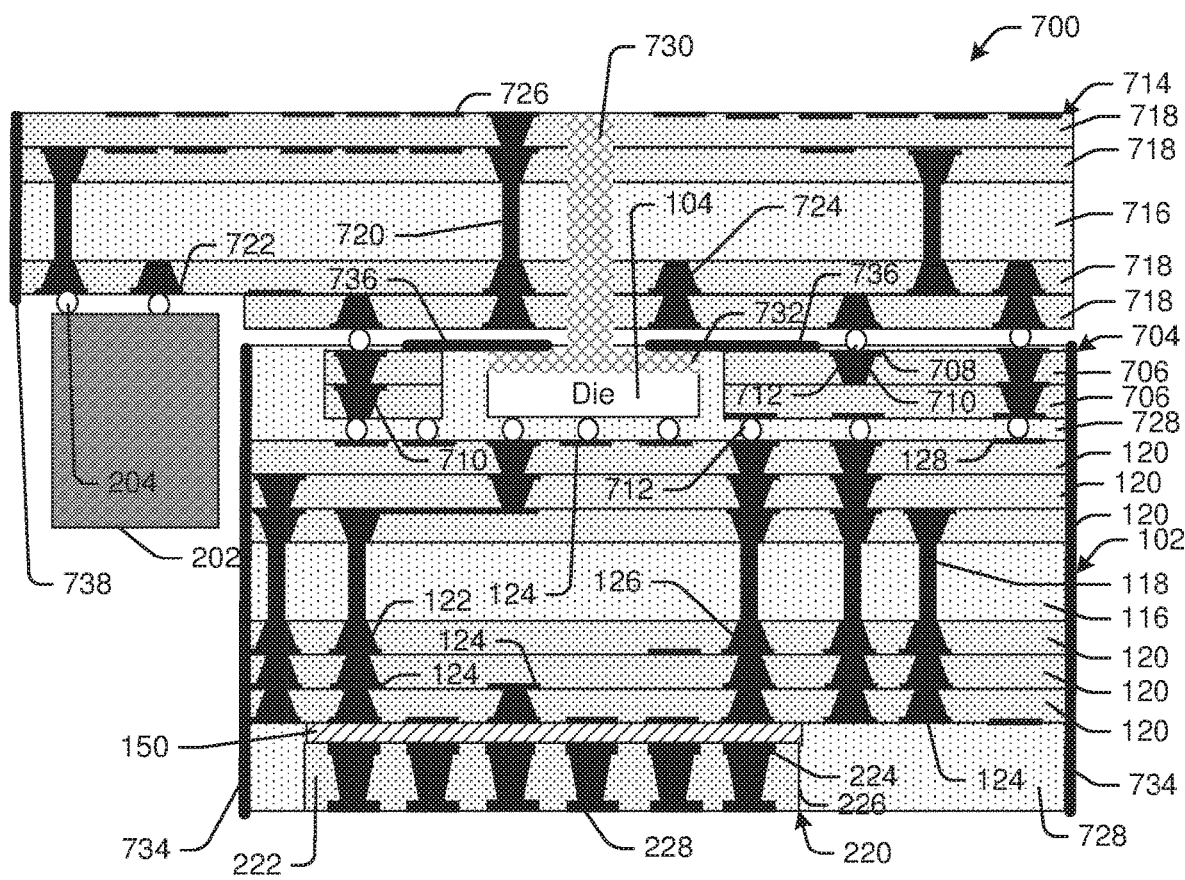
FIG. 7 depicts a simplified cross-sectional schematic diagram illustrating a configuration of a wireless module having an antenna package, a semiconductor package, and a cap package disposed on top of an interposer, along with a recessed connector, in accordance with example embodiments of the disclosure.

FIG. 7 depicts a simplified cross-sectional schematic diagram illustrating a configuration of a wireless module 700 having an antenna package 220, a semiconductor package 102, and a cap package 714 disposed on top of an interposer 704, along with a recessed connector 202, in accordance with example embodiments of the disclosure. In example embodiments, the semiconductor package 102 may include one or more build-up layers 120, where regions may be removed, such as by laser ablation or any suitable type of etch process, to form a recess. In example embodiments, such a recess may be formed to accommodate the assembly of electronic components that may have a relatively great height and, thus may pose a challenge in integration while meeting designed height and volume targets of the wireless module 700. Indeed, in some alternative embodiments, electronic components disposed on the semiconductor package may all be disposed in formed cavities, such that neither an interposer nor recesses in the cap package may be necessary. Thus, in these example embodiments, all of the electrical components assembled onto the semiconductor package and underlying the cap package may be recessed and may not protrude in height further than the topmost build-up layer of the semiconductor package.

The semiconductor package 102 may have the interposer 704 disposed thereon. In some example embodiments, the cap package 714 may not have a recess therein to accommodate the electronic components disposed on the semiconductor package 102, since the interposer 704 may provide an adequate stand-off height to accommodate electronic components 104. In other example embodiments, the cap package 714 may have a recess, where the combined height of the cap package recess and the height of the interposer 704 may be sufficient to accommodate the electronic component 104 and/or any thermal grease 732 that may be disposed thereon. In some example embodiments, the interposer 704 may be encapsulated in molding 728. It will be appreciated that the molding 728 may fully, or partially, encapsulate the electronic components 104, the interposer 704, the semiconductor package 102, and/or the antenna package 220. In some example embodiments, the molding 728 may be taller and/or wider than the elements that it encapsulates. In alternative example embodiments, the molding may extend beyond the periphery of the semiconductor package 102. In example embodiments, thermal grease 730, 732 may be provided through one or more openings in the cap package 714, such that a portion of the thermal grease 732 contacts the die 104 and other portions 732 conduct heat in a vertical direction away from the die 104.

In some example embodiments, the interposer 704 may be coreless, as depicted here. In other example embodiments, the interposer 704 may have a core upon which build-up layers may be fabricated. The interposer 704 may have one or more build-up layers 706 with metallic traces 708 and/or vias 710 formed therein. In some example embodiments, the molding 728 may have EMI shielding 734, 736 disposed thereon. As shown, the EMI shielding 734, 736 may be disposed on any variety of locations on the molding 728 and/or the interposer 704, such as in a cavity defined by the interposer 704 in which the die 104 is disposed. In some example embodiments, the cap package 714 may include one or more side plated antenna elements 738. As depicted here, a connector 202 may be connected to the cap package 714 via interconnects 204, where the connector may be disposed in a recessed portion of the cap package 714. While the connector 202 is depicted as being partially recessed, it will be appreciated that any of the elements disposed on the cap package 714 may be recessed, such as any variety of electronic component and/or die.

The cap package 714 may be joined to the interposer via one or more interconnects 712. The cap package 714 may include a core 716, with through vias 720, and one or more build-up layers 718. The build-up layers 718 may further have signaling paths 722, 724, 726, such as vias and/or traces disposed thereon for routing signals, power, ground, and/or clock. In some cases, the signaling paths 726 may form antenna radiating elements, such as at a top portion, opposing the side in contact with the interposer 704 on the cap package 714. In some example embodiments, the cap package 714 may overhang the underlying interposer 704 and/or the molding 728 thereon. In these embodiments, the cap package 714 may have one or more electrical components provided thereon, such as on the surface most proximal to the interposer 704. In some cases, the overhang of the cap package may also allow for a greater number of antenna elements 726 to be provided on the cap package 714.

Figure 8:
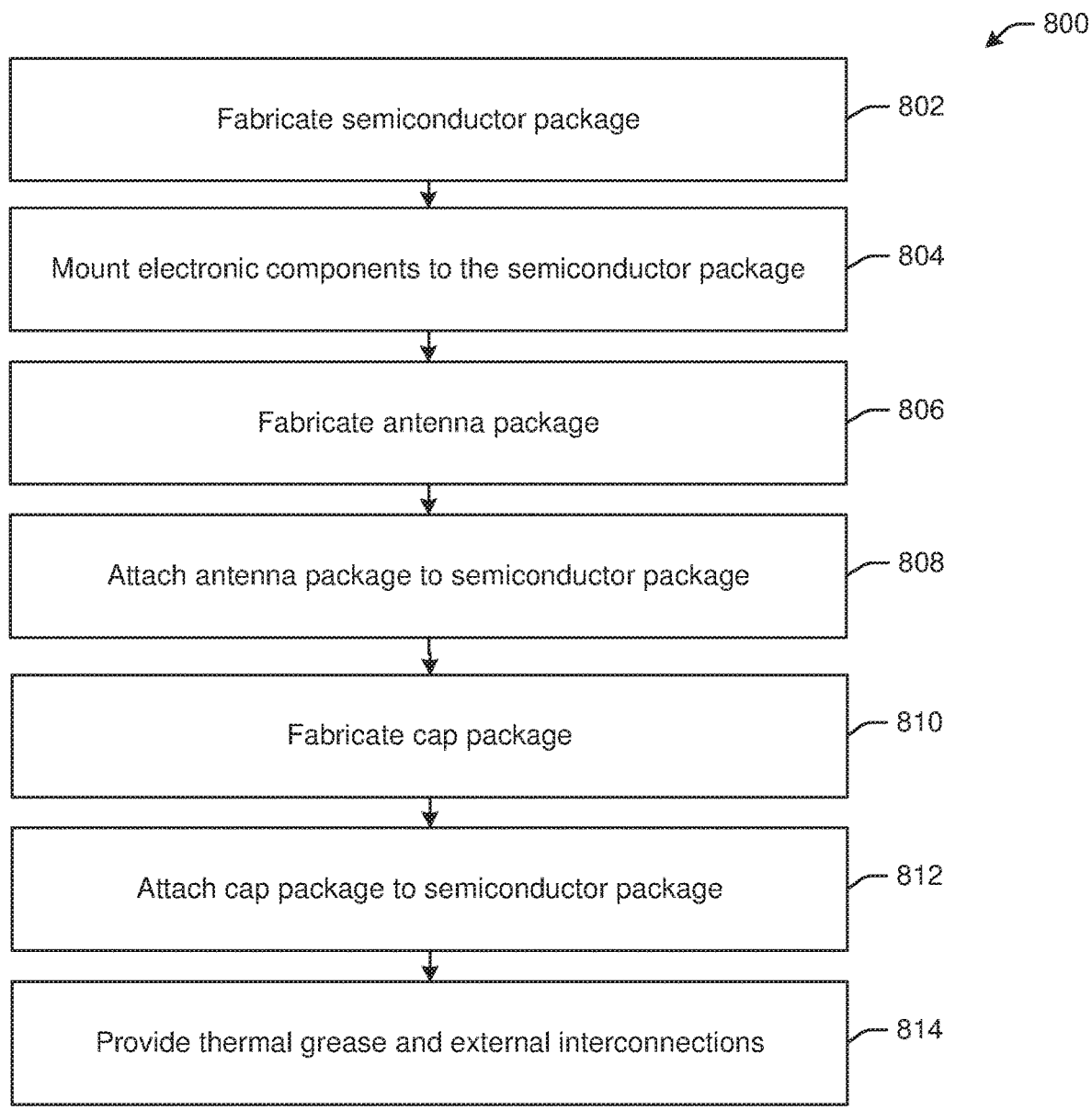
FIG. 8 depicts a flow diagram illustrating an example method for fabricating a wireless module having a package on an antenna package, in accordance with example embodiments of the disclosure.

FIG. 8 depicts a flow diagram illustrating an example method 800 for fabricating a wireless module having a semiconductor package, an antenna package, and a cap package, in accordance with example embodiments of the disclosure. This method 800 may be used to fabricate any of the wireless modules depicted in the preceding figures. It will be appreciated that some processes may be performed in an order different from that depicted herein. It will further be appreciated that some processes may have suitable substitutes that may be implemented without deviating from embodiments of the disclosure.

At block 802, a semiconductor package may be fabricated. In example embodiments, the semiconductor package may be fabricated in the form of a panel that is subsequently singulated into individual semiconductor packages. The semiconductor package may include a core and multiple build-up layers with interconnects on one or both sides of the core. The interconnects may define electrical pathways for signals to/from electrical components that are to be mounted on the semiconductor package, as well as signals being routed to a board, and/or signals being routed to an antenna package. The semiconductor package may have any suitable number of interconnect layers and may further include package-to-board interconnects, such as BGA, LGA, or the like. In some alternative embodiments, a coreless integration may be used, where there may not be a core layer.

At block 804, electronic components may be mounted to the semiconductor package. This process may include a pick-and-place system to align the electronic components to the semiconductor package. Any suitable mechanism of attachment (e.g., copper pillar, flip-chip, ACF, NCF, etc.) may be used for mounting the electronic components to the semiconductor package. The electronic components may be any suitable electronic components, such as ICs, RFICs, microcontrollers, baseband chips, microprocessors, memory chips, surface mount devices (SMDs), discrete components, transistors, diodes, resistors, inductors, capacitors, combinations thereof, or the like.

At block 806, an antenna package may be fabricated. As described above, the antenna package may have any suitable number of interconnect layers and may have pads for receiving and/or sending signals from/to the semiconductor package. The antenna package may further have a plurality of radiative antenna elements for transmitting and/or receiving wireless (e.g., RF, millimeter wave, 60 GHz, etc.) signals.

At block 808, the antenna package may be attached to the semiconductor package. Alternatively, the semiconductor package may be attached to the antenna package. The attachment may use any suitable mechanism, such as metallic bonding, epoxy, adhesive, mechanical, lamination, combinations thereof, or the like. In example embodiments, a pick-and-place system may be used for alignment and attachment.

At block 810, a cap package may be fabricated. The cap package may or may not have a core layer. The cap package may further have any suitable number of build-up layers. Portions of the build-up layers may next be removed to form a cavity. The regions of the build-up layers may be exclusion zones during design phase, where traces and/or vias may not be formed. As discussed above, the regions of the build-up layers may be different regions for different layers of the build-up. The build-up layer regions may be removed by any suitable removal process, such as laser ablation (e.g., $CO_2$ laser, UV laser, etc.), patterned wet etching, patterned dry etching, controlled depth saw, combinations thereof, or the like. In some example embodiments, one or more holes or openings may be made between an inner surface of the cavity formed by removal of the portions of the build-up layers.

At block 812, the cap package may be attached to the semiconductor package. Any suitable mechanism may be used for this attachment. The attachment may use any suitable mechanism, such as metallic bonding, epoxy, adhesive, mechanical, lamination, combinations thereof, or the like. In example embodiments, a pick-and-place system may be used for alignment and attachment.

At block 814, thermal grease and external interconnections may be provided. Thermal grease may be injected and/or pushed through holes that may be formed through the cap package. Any suitable mechanism may be used for providing the thermal grease, such as dispense, nozzle injection, squeegee, etc. External connections may be formed by assembling connectors, such as cable connectors (e.g., AFL connectors), onto the semiconductor package. In other example embodiments, package-to-board interconnects may be formed instead of or in addition to assembling the cable connectors.

It should be noted, that the method 800 may be modified in various ways in accordance with certain embodiments of the disclosure. For example, one or more operations of the method 800 may be eliminated or executed out of order in other embodiments of the disclosure. Additionally, other operations may be added to the method 700 in accordance with other embodiments of the disclosure.

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages, as disclosed herein, may be provided in any variety of electronic devices including consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package connections may be disposed. The board may include a number of components including, but not limited to, a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to some example embodiments of the disclosure, there may be a wireless module. The wireless module may include a semiconductor package having a first side and a second side opposing the first side, the semiconductor package further including an electronic component provided on the first side; an antenna package attached to the second side of the semiconductor package and having at least one radiative element; and a cap package attached to the first side of the semiconductor package and overlying the electronic component. In further example embodiments, the at least one radiative element is configured to wirelessly transmit or receive a signal, wherein the antenna package includes a first pad and the semiconductor package includes a second pad, wherein the first pad is communicatively coupled to the second pad and configured to carry the signal. In still further example embodiments, the wireless module may further include an epoxy layer disposed between the semiconductor package and the antenna package. In yet further example embodiments, the at least one radiative element is a first at least one radiative element, and wherein the cap package includes a second radiative element. According to additional example embodiments, the cap package is attached to the semiconductor package with one or more metallic interconnects.

In some example embodiments of the wireless module, the cap package may include a plurality of build-up layers including a first build-up layer, wherein at least a portion of the first build-up layer defines a cavity, wherein the electronic component is at least partially disposed within the cavity. In further example embodiments, the plurality of build-up layers include a second build-up layer, wherein at least a second portion of the second build-up layer further defines the cavity, and wherein a second electronic component is provided underlying the second build-up layer. In still further example embodiments, the cap package comprises a second electrical component disposed thereon. In yet further example embodiments, the wireless module may further include thermal grease disposed within a cavity defined by the cap package and on the electrical component. In some example embodiments, the wireless module further includes an electromagnetic shielding metal disposed on at least one of: (i) a sidewall of the cap package, or (ii) a sidewall of a cavity defined by the cap package. In further example embodiments, the wireless module includes a cable connector disposed on the first side of the semiconductor package.

According to some example embodiments of the disclosure, there may be a method. The method may include forming a semiconductor package having a first top surface and a first bottom surface opposing the first top surface, wherein the first top surface includes a first connection pad and a second connection pad and the first bottom surface includes a first coupling pad; forming an antenna package, the antenna package having a having a second top surface and a second bottom surface opposing the second top surface, wherein the second top surface includes a second coupling pad and the second bottom surface includes a first radiative element; forming an cap package, the cap package having a having a third top surface and a third bottom surface opposing the third top surface, wherein the third bottom surface includes a third connection pad and the third top surface includes a second radiative element; attaching a die to the first connection pad; and attaching the semiconductor package to the antenna package by communicatively coupling the first coupling pad with the second coupling pad; and attaching the cap package to the semiconductor package by connecting the second connecting pad with the third connecting pad. In some example embodiments, forming the cap package further includes providing a packaging core having a first core surface and a second core surface; forming through-vias in the packaging core; forming a first build-up layer overlying the first core surface; forming a second build-up layer overlying the first build-up layer; and removing a portion of the second build-up layer to define a cavity. In still further example embodiments, attaching the cap package to the semiconductor package comprises aligning the cap package to the semiconductor package, wherein the die is at least partially contained in the cavity.

In some example embodiments, forming the cap package further includes forming an opening from the third top surface to the cavity, and wherein attaching the cap package to the semiconductor package further comprises providing thermal grease through the opening. In further example embodiments, removing the portion of the second build-up layer includes at least one of: (i) laser ablation, (ii) saw, (iii) dry etch, or (iv) wet etch. In still further example embodiments, the method further includes plating at least a part of a sidewall of the cavity to form an electromagnetic shield. In yet further example embodiments, the cap package includes a fourth connection pad, the method further comprising attaching an electrical component to the cap package within the cavity and to the fourth connection pad. In additional example embodiments, attaching the semiconductor package to the antenna package includes providing epoxy on the first bottom surface; aligning and placing the antenna package such that the first coupling pad substantially aligns with the second coupling pad; and curing the epoxy. In some further example embodiments, forming the cap package further comprises providing a second die embedded in a plurality of build-up layers of the cap package.

According to some example embodiments of the disclosure, there may be an electronic device. The electronic device may include a wireless module having a semiconductor package having a first side and a second side opposing the first side, the semiconductor package further including an electronic component provided on the first side; an antenna package attached to the second side of the semiconductor package and having at least one radiative element; and a cap package attached to the first side of the semiconductor package and overlying the electronic component. In further example embodiments, the at least one radiative element is configured to wirelessly transmit or receive a signal, wherein the antenna package includes a first pad and the semiconductor package includes a second pad, wherein the first pad is communicatively coupled to the second pad and configured to carry the signal. In still further example embodiments, the electronic device may further include an epoxy layer disposed between the semiconductor package and the antenna package. In yet further example embodiments, the at least one radiative element is a first at least one radiative element, and wherein the cap package includes a second radiative element. According to additional example embodiments, the cap package is attached to the semiconductor package with one or more metallic interconnects.

In some example embodiments of the electronic device, the cap package may include a plurality of build-up layers including a first build-up layer, wherein at least a portion of the first build-up layer defines a cavity, wherein the electronic component is at least partially disposed within the cavity. In further example embodiments, the plurality of build-up layers include a second build-up layer, wherein at least a second portion of the second build-up layer further defines the cavity, and wherein a second electronic component is provided underlying the second build-up layer. In still further example embodiments, the cap package comprises a second electrical component disposed thereon. In yet further example embodiments, the electronic device may further include thermal grease disposed within a cavity defined by the cap package and on the electrical component. In some example embodiments, the electronic device further includes an electromagnetic shielding metal disposed on at least one of: (i) a sidewall of the cap package, or (ii) a sidewall of a cavity defined by the cap package. In further example embodiments, the electronic device includes a cable connector disposed on the first side of the semiconductor package.

The claimed invention is:

1. A wireless module, comprising:
a semiconductor package having a first side and a second side opposing the first side, the semiconductor package further including an electronic component provided on the first side;
an antenna package attached to the second side of the semiconductor package and having at least one radiative element; and
a cap package attached to the first side of the semiconductor package and overlying the electronic component.

2. The wireless module of claim 1, wherein the at least one radiative element is configured to wirelessly transmit or receive a signal, wherein the antenna package includes a first pad and the semiconductor package includes a second pad, wherein the first pad is connected to the second pad and configured to carry the signal.

3. The wireless module of claim 1, further comprising an epoxy layer disposed between the semiconductor package and the antenna package.

4. The wireless module of claim 1, wherein the at least one radiative element is a first at least one radiative element, and wherein the cap package includes a second radiative element.

5. The wireless module of claim 1, wherein the cap package is attached to the semiconductor package with one or more metallic interconnects.

6. The wireless module of claim 1, wherein the cap package include a plurality of build-up layers including a first build-up layer, wherein at least a portion of the first build-up layer defines a cavity, wherein the electronic component is at least partially disposed within the cavity.

7. The wireless module of claim 6, wherein the plurality of build-up layers include a second build-up layer, wherein at least a second portion of the second build-up layer further defines the cavity, and wherein a second electronic component is provided underlying the second build-up layer.

8. The wireless module of claim 1, wherein the cap package comprises a second electrical component disposed thereon.

9. The wireless module of claim 1, further comprising thermal grease disposed within a cavity defined by the cap package and on the electrical component.

10. The wireless module of claim 1, further comprising an electromagnetic shielding metal disposed on at least one of: (i) a sidewall of the cap package, or (ii) a sidewall of a cavity defined by the cap package.

11. The wireless module of claim 1, further comprising a cable connector disposed on the first side of the semiconductor package.

12. A method, comprising:
forming a semiconductor package having a first top surface and a first bottom surface opposing the first top surface, wherein the first top surface includes a first connection pad and a second connection pad and the first bottom surface includes a first coupling pad;
forming an antenna package, the antenna package having a second top surface and a second bottom surface opposing the second top surface, wherein the second top surface includes a second coupling pad and the second bottom surface includes a first radiative element;

forming a cap package, the cap package having a third top surface and a third bottom surface opposing the third top surface, wherein the third bottom surface includes a third connection pad and the third top surface includes a second radiative element;

attaching a die to the first connection pad;

attaching the semiconductor package to the antenna package connecting the first coupling pad with the second coupling pad; and attaching the cap package to the semiconductor package by connecting the second connecting pad with the third connecting pad.

13. The method of claim 12, wherein forming the cap package further comprises:

providing a packaging core having a first core surface and a second core surface;

forming through-vias in the packaging core;

forming a first build-up layer overlying the first core surface;

forming a second build-up layer overlying the first build-up layer; and removing a portion of the second build-up layer to define a cavity.

14. The method of claim 13, wherein attaching the cap package to the semiconductor package comprises aligning the cap package to the semiconductor package, wherein the die is at least partially contained in the cavity.

15. The method of claim 13, wherein forming the cap package further comprises forming an opening from the third top surface to the cavity, and wherein attaching the cap package to the semiconductor package further comprises providing thermal grease through the opening.

16. The method of claim 13, wherein removing the portion of the second build-up layer comprises at least one of: (i) laser ablation, (ii) saw, (iii) dry etch, or (iv) wet etch.

17. The method of claim 13, further comprising plating at least a part of a sidewall of the cavity to form an electromagnetic shield.

18. The method of claim 13, wherein the cap package includes a fourth connection pad, the method further comprising attaching an electrical component to the cap package within the cavity and to the fourth connection pad.

19. The method of claim 12, wherein attaching the semiconductor package to the antenna package comprises:

providing epoxy on the first bottom surface;

aligning and placing the antenna package such that the first coupling pad substantially aligns with the second coupling pad; and curing the epoxy.

20. The method of claim 12, wherein forming the cap package further comprises providing a second die embedded in a plurality of build-up layers of the cap package.

* * * * *